(12) United States Patent
Her et al.

(10) Patent No.: US 11,482,692 B2
(45) Date of Patent: Oct. 25, 2022

(54) DISPLAY INCLUDING OPENING FOR MOUNTING SENSOR

(71) Applicant: SAMSUNG ELECTRONICS CO., LTD., Suwon-si (KR)

(72) Inventors: Yongkoo Her, Suwon-si (KR); Hyunchang Shin, Suwon-si (KR); Joongyu Lee, Suwon-si (KR); Songhee Jung, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 148 days.

(21) Appl. No.: 16/961,831

(22) PCT Filed: Jan. 23, 2019

(86) PCT No.: PCT/KR2019/000950
§ 371 (c)(1),
(2) Date: Jul. 13, 2020

(87) PCT Pub. No.: WO2019/147012
PCT Pub. Date: Aug. 1, 2019

(65) Prior Publication Data
US 2021/0083227 A1     Mar. 18, 2021

(30) Foreign Application Priority Data

Jan. 23, 2018 (KR) .................. 10-2018-0008286

(51) Int. Cl.
*H01L 51/00*     (2006.01)
*H01L 51/52*     (2006.01)
(Continued)

(52) U.S. Cl.
CPC ...... *H01L 51/5253* (2013.01); *H01L 27/3234* (2013.01); *H01L 27/3248* (2013.01);
(Continued)

(58) Field of Classification Search
CPC ............... H01L 51/5253; H01L 51/524; H01L 51/0096; H01L 51/5237; H01L 51/5246;
(Continued)

(56) References Cited

U.S. PATENT DOCUMENTS 6,734,463 B2   5/2004   Ishikawa
7,095,046 B2   8/2006   Ishikawa
(Continued)

FOREIGN PATENT DOCUMENTS

CN   103081157   5/2013
CN   107241465   10/2017
(Continued)

OTHER PUBLICATIONS

International Search Report for PCT/KR2019/000950, dated May 24, 2019, 4 pages.
(Continued)

*Primary Examiner* — Ida M Soward
(74) *Attorney, Agent, or Firm* — Nixon & Vanderhye, P.C.

(57) ABSTRACT

A display is provided. The display includes a display substrate layer, an organic light emitting layer that is formed over the display substrate layer and that includes a plurality of pixels, a thin film transistor array layer that is disposed between the display substrate layer and the organic light emitting layer and that includes a plurality of thin film transistors electrically connected with the pixels, a thin film encapsulation layer formed on at least part of the organic light emitting layer, a sensor mounting part including an opening formed through the organic light emitting layer, the thin film transistor array layer, and the display substrate layer and a sensor disposed in the opening, and a sealing member formed in the opening to prevent the organic light emitting layer and the thin film transistor array layer from
(Continued)

being exposed to the outside through an inner sidewall of the opening. The opening includes a first portion formed in the display substrate layer and a second portion formed in the remainder, and the sealing member is formed in the second portion and at least part of the first portion.

15 Claims, 9 Drawing Sheets

(51) Int. Cl.
| | |
|---|---|
| *H01L 27/14* | (2006.01) |
| *H01L 27/32* | (2006.01) |
| *G02F 1/133* | (2006.01) |
| *G06F 1/16* | (2006.01) |
| *G09F 9/30* | (2006.01) |
| *H01L 27/146* | (2006.01) |
| *G02F 1/1335* | (2006.01) |
| *G02F 1/1333* | (2006.01) |

(52) U.S. Cl.
CPC ...... *H01L 51/524* (2013.01); *G02F 1/133305* (2013.01); *G02F 1/133528* (2013.01); *G06F 1/1641* (2013.01); *G06F 1/1652* (2013.01); *G09F 9/301* (2013.01); *G09G 2300/0408* (2013.01); *H01L 27/14678* (2013.01); *H01L 27/3213* (2013.01); *H01L 51/0097* (2013.01); *H01L 51/5246* (2013.01); *H01L 2251/301* (2013.01); *H01L 2251/5338* (2013.01)

(58) Field of Classification Search
CPC ............. H01L 51/5295; H01L 51/0097; H01L 2251/5338; H01L 27/3234; H01L 27/3211; H01L 27/323; H01L 27/14678; H01L 27/3213; H01L 2251/301; G02F 1/133528; G02F 1/133305; G02F 2001/13357; G06F 9/301; G06F 1/1641; G06F 1/1652
See application file for complete search history.

(56) References Cited

U.S. PATENT DOCUMENTS

| | | | |
|---|---|---|---|
| 8,970,804 B2* | 3/2015 | Kwon | ............... G02F 1/133512 |
| | | | 349/110 |
| 9,035,545 B2 | 5/2015 | Jeong et al. | |
| 9,847,488 B2 | 12/2017 | Yang et al. | |
| 9,997,738 B2 | 6/2018 | Choi et al. | |
| 10,466,822 B2* | 11/2019 | Kim | ..................... G06F 3/041 |
| 2003/0116768 A1 | 6/2003 | Ishikawa | |
| 2004/0188692 A1 | 9/2004 | Ishikawa | |
| 2012/0206669 A1* | 8/2012 | Kim | .................. G02F 1/133308 |
| | | | 349/153 |
| 2012/0327325 A1* | 12/2012 | Park | ..................... G06F 1/1686 |
| | | | 349/58 |
| 2013/0207093 A1 | 8/2013 | Jeong et al. | |
| 2013/0258234 A1* | 10/2013 | Park | .................. G02F 1/133528 |
| | | | 349/58 |
| 2014/0063407 A1* | 3/2014 | Kwon | ............... G02F 1/133512 |
| | | | 349/106 |
| 2017/0149014 A1 | 5/2017 | Choi et al. | |
| 2017/0187934 A1* | 6/2017 | Kwak | .................. H04N 5/2251 |
| 2017/0200890 A1 | 7/2017 | Yang et al. | |
| 2017/0287992 A1 | 10/2017 | Kwak et al. | |
| 2018/0151641 A1* | 5/2018 | Choo | .................. H04M 1/0266 |
| 2018/0294436 A1 | 10/2018 | Choi et al. | |
| 2020/0258957 A1 | 8/2020 | Kwak et al. | |

FOREIGN PATENT DOCUMENTS

| | | |
|---|---|---|
| EP | 2 579 353 | 4/2013 |
| EP | 3 266 101 | 10/2017 |
| KR | 10-2012-0004943 | 1/2012 |
| KR | 10-2017-0059537 | 5/2017 |
| KR | 10-2017-0098122 | 8/2017 |
| KR | 10-2017-0111827 | 10/2017 |

OTHER PUBLICATIONS

Written Opinion of the ISA for PCT/KR2019/000950, dated May 24, 2019, 5 pages.
Extended European Search Report dated Apr. 1, 2021 in EP Application No. 19743306.3.
Notification of First Office Action dated Sep. 27, 2021 in Chinese Application No. 201980009290.7 and English-language translation.

* cited by examiner

DISPLAY INCLUDING OPENING FOR MOUNTING SENSOR

DISPLAY INCLUDING OPENING FOR MOUNTING SENSOR

This application is the U.S. national phase of International Application No. PCT/KR2019/000950 filed 23 Jan. 2019, which designated the U.S. and claims priority to KR Patent Application No. 10-2018-0008286 filed 23 Jan. 2018, the entire contents of each of which are hereby incorporated by reference.

FIELD

The disclosure relates to a display including an opening for mounting a sensor.

DESCRIPTION OF RELATED ART

With the development of information technology (IT), various forms of electronic devices, such as smartphones, tablet personal computers (PCs), and the like, which include a display have been widely used.

A display of an electronic device may include an active area in which a screen is displayed and an inactive area that surrounds the active area.

Sensors may be exposed on a front side of the electronic device. The sensors, such as various sensors including an illuminance sensor, an iris sensor, and the like and a camera module, may be disposed. For example, the electronic device may detect the brightness outside the electronic device through the illuminance sensor and may adjust screen brightness of the display, based on an outcome of the detection. In another example, the electronic device may take a photo or a video through the camera module.

The sensors may be disposed inside the electronic device or inside the display. A sensor exposed through a bezel area on the front side may be disposed in the inactive area of the display or inside a housing to which the display does not extend. In contrast, a sensor exposed through a display area on the front side may be disposed in the active area of the display.

Recently, to meet user demands for design and maximize visibility, there is a tendency to eliminate a bezel area from a front side of an electronic device and utilize the entire front side as a display area. Accordingly, an attempt is made to mount a sensor in an active area of a display.

SUMMARY

To mount the sensor in the active area of the display, a hole has to be formed in a display panel. In this case, light emitting elements, a common electrode, or a circuit board may be exposed to the outside through the hole. In particular, there is a problem that pixels constituted by organic light emitting diodes are vulnerable to oxygen or moisture.

Embodiments of the disclosure provide a display for solving the aforementioned problems.

Technical Solution

According to various embodiments, a display includes a display substrate layer, an organic light emitting layer that is formed over the display substrate layer and that includes a plurality of pixels, a thin film transistor array layer that is disposed between the display substrate layer and the organic light emitting layer and that includes a plurality of thin film transistors electrically connected with the pixels, a thin film encapsulation layer formed over the organic light emitting layer, and a sealing member that covers at least part of an inner sidewall of an opening formed through the display substrate layer, the organic light emitting layer, and the thin film transistor array layer, in which the at least part of the inner sidewall of the opening includes at least part of a partial sidewall formed by the display substrate layer.

According to various embodiments, a display for mounting a sensor includes a display substrate layer, an organic light emitting layer that is formed over the display substrate layer and that includes a plurality of pixels, a thin film transistor array layer that is disposed between the display substrate layer and the organic light emitting layer and that includes a plurality of thin film transistors electrically connected with the pixels, a thin film encapsulation layer formed on at least part of the organic light emitting layer, a sensor mounting part including an opening formed through the organic light emitting layer, the thin film transistor array layer, and the display substrate layer and a sensor disposed in the opening, and a sealing member formed in the opening to prevent the organic light emitting layer and the thin film transistor array layer from being exposed to the outside through an inner sidewall of the opening. The opening includes a first portion formed in the display substrate layer and a second portion formed in the remainder, and the sealing member is formed in the second portion and at least part of the first portion.

According to the embodiments of the disclosure, the sensor may be mounted in an active area, and the active area may be expanded by reducing or removing an inactive area of the display. Accordingly, the active area may be expanded to the entire front side of an electronic device.

In addition, the disclosure may provide various effects that are directly or indirectly recognized.

BRIEF DESCRIPTION OF THE DRAWINGS

FIG. 2 is a sectional view taken along line A-A' of FIG. 1.

FIG. 3 is a sectional view taken along line B-B' of FIG. 1.

FIG. 4 is a sectional view taken along line B-B' of FIG. 1.

DETAILED DESCRIPTION OF EXAMPLE EMBODIMENTS

Hereinafter, various embodiments of the present invention will be described with reference to the accompanying drawings. However, this is not intended to limit the present invention to specific embodiments, and it should be understood that it includes various modifications, equivalents, and/or alternatives of the embodiments of the present invention.

Figure 1:
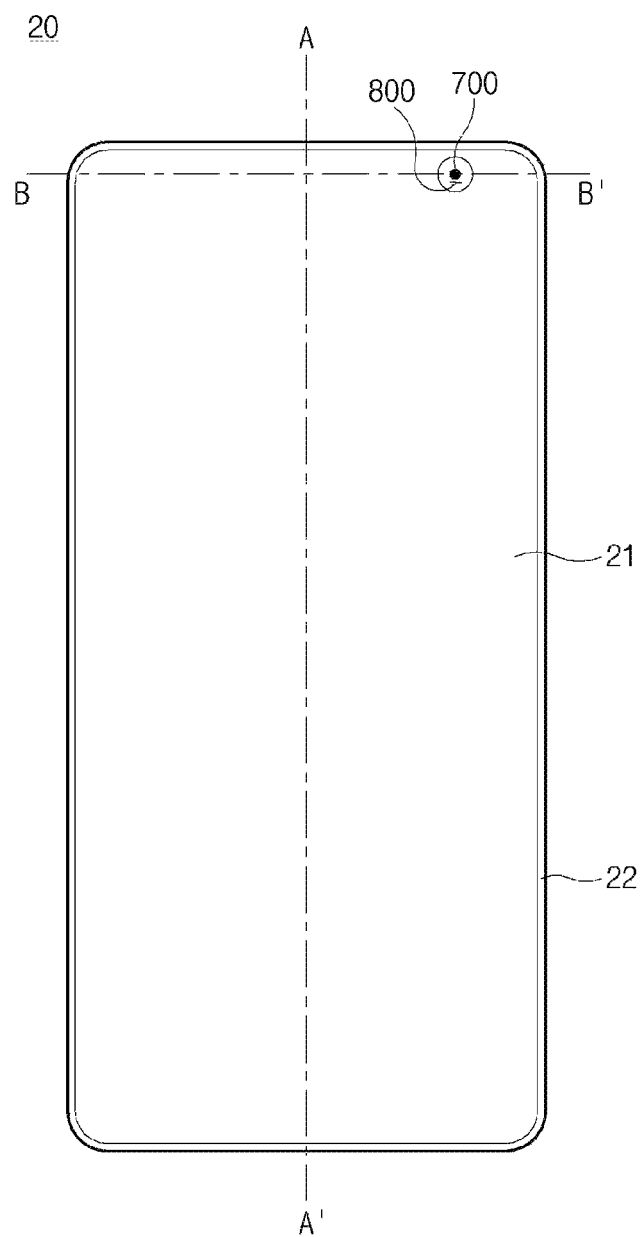
FIG. 1 is a view illustrating a front side of an electronic device according to various embodiments.

FIG. 1 is a view illustrating a front side of an electronic device 20 including a display 10 according to various embodiments.

Referring to FIG. 1, the electronic device 20 including the display 10 according to various embodiments is illustrated.

The electronic device 20 may include a housing 22 and the display 10 provided inside the housing 22. A display area 21 of the electronic device may refer to an area where a screen is displayed by pixels and may correspond to an active area of the display 10 disposed inside the housing of the electronic device 20.

In various embodiments, the display area 21 may be formed on at least part of a front part of the housing 22. The display area 21 may be formed on the entire front part of the housing 22.

An opening having a shape corresponding to the display area 21 may be formed in the front part of the housing 22. In the display area 21 where the opening is formed, the display 10 provided inside the housing 22 may be disposed so as to be exposed.

A transparent layer 150 of the display 10 may be formed at the opening of the front part of the housing 22. Through the transparent layer of the display 10, the screen of the display 10 may be displayed on the front side of the electronic device 20. Furthermore, a sensor 700 mounted in the display may be exposed through the front side.

The display 10 and the sensor 700 may be disposed inside the housing 22. For example, the display 10 and the sensor 700 may be disposed between the transparent layer 150 and a second surface 22b of the housing 22.

The sensor 700 may be mounted in an opening 800 formed in the active area of the display 10. An upper surface of the sensor 700 may be disposed to face the transparent layer 150. The sensor 700 may be an optical sensor capable of receiving external light passing through the transparent layer 150.

By mounting the sensor 700 in the active area 220 of the display 10, the entire front part of the housing 22 may be configured as the display area 21. Accordingly, a large screen may be provided to a user of the electronic device 20.

To this end, a structure for mounting the sensor 700 in the active area of the display 10 may be considered.

The type or position of the sensor 700 illustrated in FIG. 1 or the number of sensors 700 is illustrative and is not limited to that illustrated. For example, the sensor 7000 may include at least one of a proximity sensor, an illuminance sensor, a gesture sensor, a motion sensor, a fingerprint recognition sensor, and a biometric sensor. The sensor may include an image sensor for taking an image or a video. Alternatively, the sensor may be a camera.

According to various embodiments, the sensor 700 may obtain image data. For example, external light may be incident through the sensor, and the sensor 700 may obtain image data corresponding to the incident light. In various embodiments, the image data may correspond to data obtained by converting the incident light into an electrical signal by the sensor.

Figure 2:
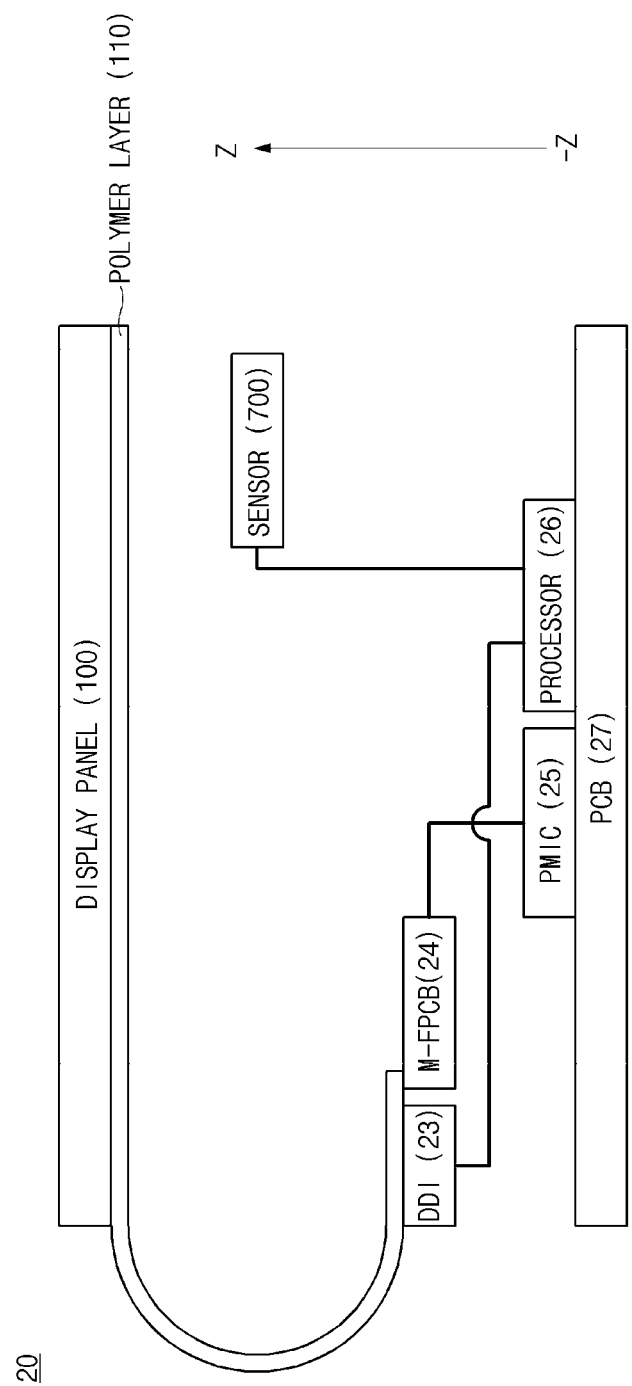
FIG. 2 is a sectional view of the electronic device according to various embodiments, where

FIG. 2 is a sectional view of the electronic device according to various embodiments. FIG. 2 is a sectional view taken along line A-A' of FIG. 1.

Referring to FIG. 2, the electronic device 20 may include the display 10, the sensor 700, a printed circuit board (PCB) 27, a power management integrated circuit (PMIC) 25, and a processor 26.

The display 10 may include a display panel 100, a polymer layer 110, a display driver integrated circuit (DDI) 23, and a module-flexible printed circuit board 24.

According to various embodiments, the display panel may include a plurality of pixels.

The plurality of pixels may each include a red sub-pixel, a green sub-pixel, and a blue sub-pixel. Alternatively, the plurality of pixels may each include a red sub-pixel, a green sub-pixel, a blue sub-pixel, and a green sub-pixel. In another case, the plurality of pixels may each include a red sub-pixel, a green sub-pixel, a blue sub-pixel, and a white sub-pixel.

The polymer layer 110 may be disposed in the −z direction of the display panel 100. The polymer layer 110 may include wiring for supplying power and/or signals to the display panel 100. According to various embodiments, the polymer layer 110 may be formed of a flexible material and may extend from one end of the display panel 100 to the module-flexible printed circuit board 24.

The display driver IC (DDI) 23 may be disposed on a partial area of the polymer layer 110. The display driver IC 23 may control the pixels through the polymer layer 110.

In various embodiments, a film may be disposed between the display driver IC 23 and the polymer layer 110. That is, the film is attached to one end of the polymer layer 110, and the display driver IC 23 may be disposed on the film.

The module-flexible printed circuit board 24 may be electrically connected with a partial area of the polymer layer 110. For example, the module-flexible printed circuit board 24 may be electrically connected with a conductive pattern (or, wiring) formed on the polymer layer 110. In this disclosure, the module-flexible printed circuit board 24 may be referred to as the M-FPCB (module-flexible printed circuit board).

The printed circuit board 27 may be disposed in the −z direction of the display 10. Various types of parts (e.g., the processor 26 and a memory) included in the electronic device 20 may be mounted on the printed circuit board 27.

The power management integrated circuit 25 may supply pixel power to the pixels. For example, the power management integrated circuit 25 may apply a first voltage (e.g., ELVDD) to one end of each of the pixels and may apply a second voltage (e.g., ELVSS) to an opposite end of the pixel. The pixels receiving the pixel power may emit light.

The processor 26 (e.g., an application processor) may turn on the sensor 700 in response to a user input for recognizing biometric information.

For example, in a case where the sensor 700 is a camera, the processor 26 may control the sensor 700 to obtain image data corresponding to light that is reflected from a subject outside the electronic device 20 or is generated from the subject. As will be described below, the sensor 700 may be disposed in the opening 800 formed through at least part of the display 10 and may receive external light.

In another example, in a case where the sensor 700 is an infrared sensor, when the user wants to unlock a lock screen, the processor 26 may control the sensor 700 (or, a light emitting element) to emit light in the infrared band. The light emitted from the sensor 700 may be reflected from a body (e.g., an iris or a finger) of the user and may be introduced into the electronic device 20 again. The processor 26 may perform user authentication, based on the introduced light. When an outcome of the authentication shows that the user is authenticated, the processor 26 may unlock the lock screen.

Meanwhile, the embodiment illustrated in FIG. 2 is merely illustrative, and a stack structure of the electronic device 20 and components included in the electronic device 20 are not limited to those illustrated in FIG. 2. For example, the display 10 may be configured in a chip on film (COF) type in which various types of parts are disposed on a thin film or in a chip on glass (COG) type in which the display driver IC 23 is directly mounted on a glass substrate.

Figure 12:
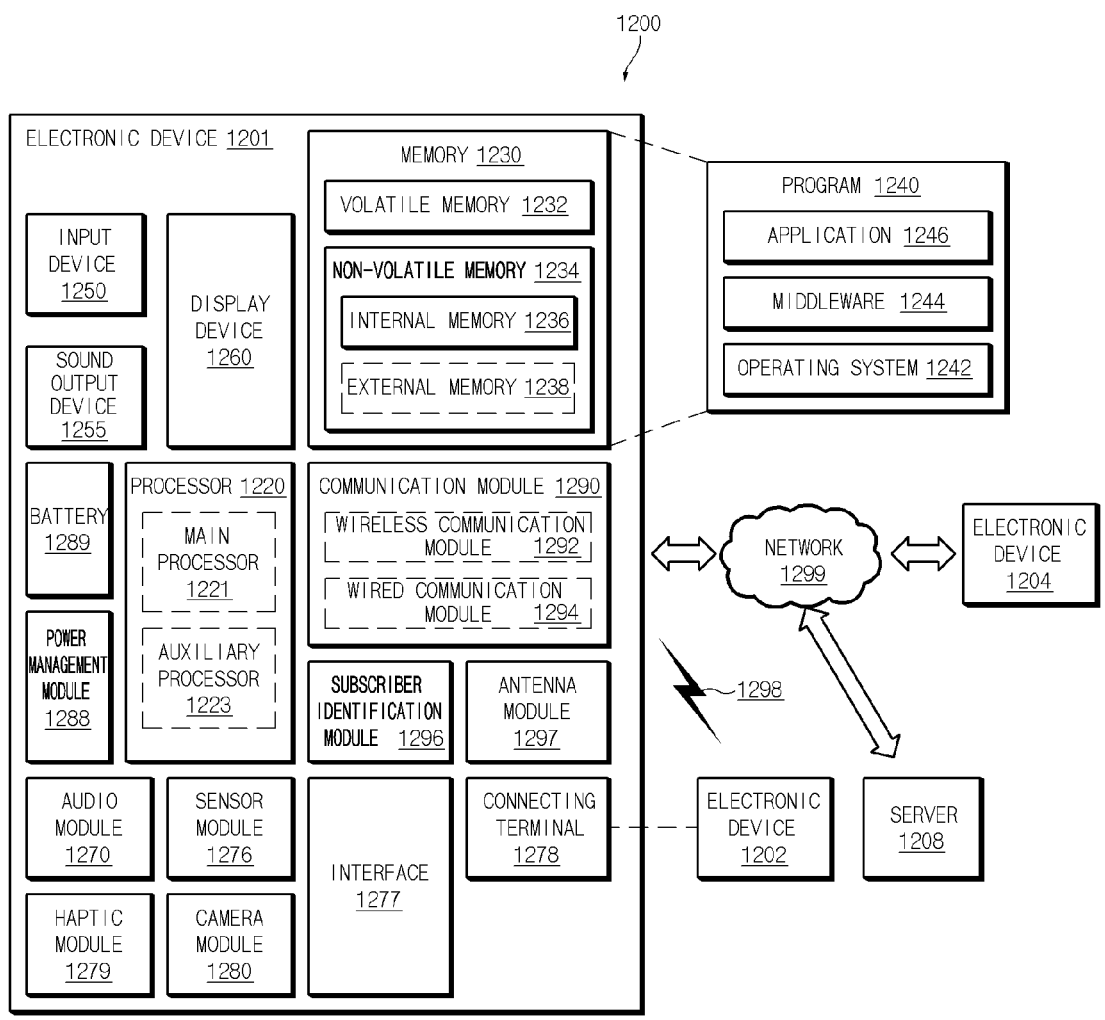
FIG. 12 is a block diagram of an electronic device in a network environment according to various embodiments, where the electronic device includes a display including an opening for mounting a sensor.

According to various embodiments, the electronic device may include a memory (e.g., 930 of FIG. 12). The memory may include instructions capable of controlling the display driver IC 23 and/or the processor 26.

Figure 3:
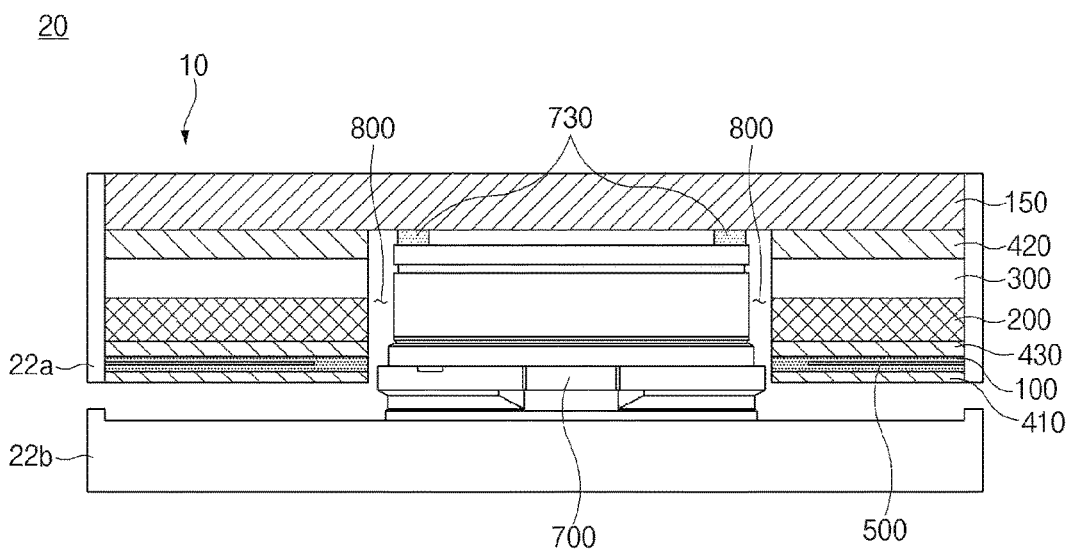
FIG. 3 is a sectional view of the electronic device according to various embodiments, where

FIG. 3 is a sectional view of the electronic device according to various embodiments. FIG. 3 is a sectional view taken along line B-B' of FIG. 1.

Referring to FIG. 3, the electronic device 20 may include the housing 22 and the display 10 disposed inside the housing.

The display 10 may include, from a lower side toward an upper side, a first adhesive layer 410, the display panel 100, a third adhesive layer 430, a touch screen panel 200, a polarizer 300, a second adhesive layer 420, and the transparent layer 150. The display 10 may be exposed through the transparent layer 150.

According to various embodiments, the transparent layer 150 may serve to protect the touch screen panel 200 in the display 10 from external shock and may be formed of a transparent material. For example, the transparent layer 150 may allow light generated inside the electronic device 20 to transmit to the outside. Furthermore, the transparent layer 150 may allow light outside the electronic device 20 to transmit into the electronic device. The transparent layer 150 may be formed of a material having excellent light transmittance, heat resistance, chemical resistance, mechanical strength, and the like.

The transparent layer 150 may be a transparent film or a glass substrate formed of polyethyleneterephthalate or the like, or may be a plastic substrate formed of polymethylmethacrylate, polyamide, polyimide, polypropylene, polyurethane, or the like.

The display 10 may include, for example, a liquid crystal display (LCD), a light-emitting diode (LED) display, an organic light-emitting diode (OLED) display, a microelectromechanical systems (MEMS) display, or an electronic paper display.

According to various embodiments, the first adhesive layer 410 may be disposed between the second surface 22b of the housing 22 and the transparent layer 150. The first adhesive layer 410 may be a double-sided tape that is at least partially opaque. The first adhesive layer 410 may bond the display panel 100 and a flexible printed circuit board (FPCB) (not illustrated) that is able to be disposed on the second surface 22b of the housing 22. The first adhesive layer 410 may be an optical clear adhesive (OCA). The first adhesive layer 410 may be a thin adhesive film corresponding to the shape of the display panel 100.

According to various embodiments, the display panel 100 may be disposed between the first adhesive layer 410 and the third adhesive layer 430 disposed under the touch screen panel 200.

According to various embodiments, the touch screen panel 200 may be disposed between the third adhesive layer 430 and the second adhesive layer 420 disposed under the transparent layer 150. The touch screen panel 200 may be coupled with the transparent layer 150 by the third adhesive layer 430 and may sense the position of the user's touch occurring on the transparent layer 150. The touch screen panel 200 may be constituted by a touch detection sensor of a capacitive overlay type, a resistive overlay type, an infrared beam type, or the like, or may include at least one of a pressure sensor or a fingerprint sensor. In addition to the sensors, various sensors capable of sensing contact or pressure of an object may be included in the touch screen panel 200.

As illustrated in FIG. 3, the touch screen panel 200 may be formed in an add-on type separate from the display 10. However, this is illustrative, and the touch screen panel 200 may include various types of touch screen panels.

For example, the touch screen panel 200 may be integrally formed with the display, in an on-cell type in which the touch screen panel 200 is coupled to the top of the display 10. Alternatively, the touch screen panel 200 may be formed in an in-cell type in which the touch screen panel 200 is included inside the display 100. According to various embodiments, the second adhesive layer 420 may be disposed between the touch screen panel 200 and the transparent layer 150 and may bond the touch screen panel 200 and the transparent layer 150. The polarizer 300 may be disposed between the second adhesive layer 420 and the touch screen panel 200. The second adhesive layer 420 may be an optical clear adhesive (OCA) that is substantially transparent. The second adhesive layer 420 may contain an optically transparent polymer material.

According to various embodiments, the polarizer 300 may be further included between the second adhesive layer 420 and the touch screen panel 200. The polarizer (POL) 300 may polarize incident light incident on the touch screen panel 200 and reflective light resulting from reflection of the incident light from the touch screen panel 200. The polarizer 300 may be attached to the transparent layer 150 through the second adhesive layer 420 and may perform a function of preventing scattering when the transparent layer 150 is damaged.

According to various embodiments, the opening 800 may be formed through at least some or all of the first adhesive layer 410, the display panel 100, the third adhesive layer 430, the touch screen panel 200, the polarizer 300, and the second adhesive layer 420. The opening 800 may be located within the range of 1 mm to 20 mm from the periphery of the front part of the housing 22.

As will be described below, a thin film encapsulation layer may be formed inward of the display panel 100 of the display 10. The thin film encapsulation layer, when the opening 800 is formed in the display 10, may interrupt contact with an external environment such that moisture does not infiltrate into the display panel 100. For planarization of the thin film encapsulation layer, a buffer layer formed of the same material as the thin film encapsulation layer may be additionally provided on the thin film encapsulation layer.

According to various embodiments, at least part of the sensor 700 may be disposed in the opening 800. Alternatively, the sensor 700 may be disposed under the opening depending on the form of the sensor 700. The sensor 700 may include one or more image sensors (e.g., front sensors or rear sensors) that pass through at least part of the opening 800 and face toward the transparent layer 150. The sensor 700 may be, for example, a device capable of taking a still image and a video and may include a lens, an image signal processor (ISP), or a flash (e.g., an LED, a xenon lamp, or the like).

According to various embodiments, one or more sponges 730 may preferably be mounted between the transparent layer 150 and the sensor 170, which is disposed under the transparent layer 150, to prevent infiltration of dust into the lens of the sensor 700 and absorb shock applied from the outside to the sensor 700.

According to various embodiments, a plurality of conductive wires 500 extending to a surrounding portion of the opening 800 when viewed from the transparent layer 150 may be disposed in the display panel 100 of the display 10 so as not to optically block the opening 800.

Figure 4:
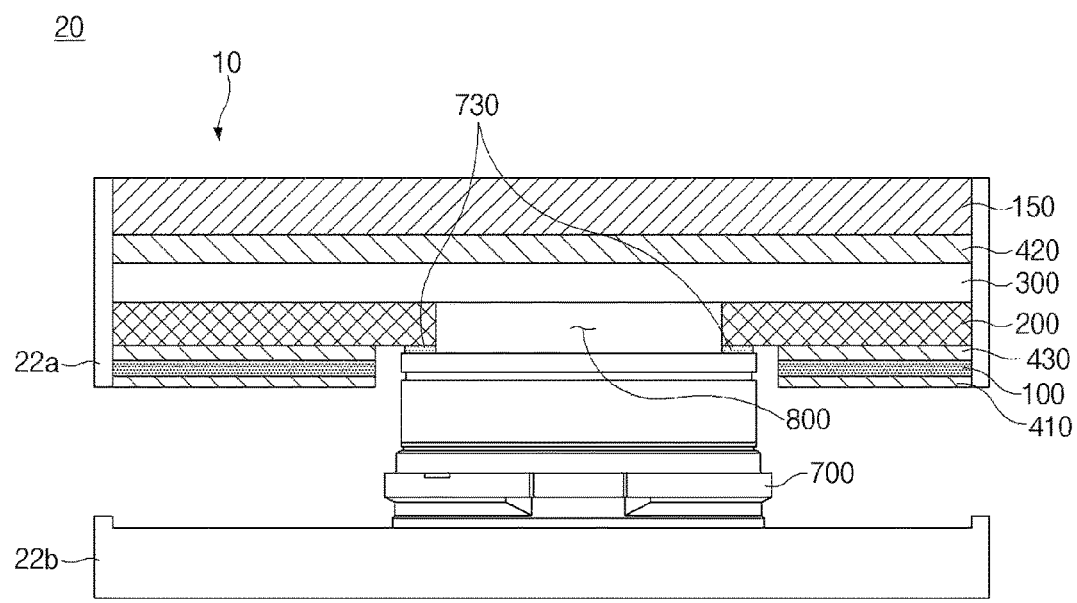
FIG. 4 is a sectional view of the electronic device according to various embodiments, where

FIG. 4 is a sectional view of another example of the electronic device according to various embodiments. FIG. 4 is a sectional view taken along line B-B' of FIG. 1.

As illustrated in FIG. 4, the electronic device according to various embodiments of the disclosure may include, from top to bottom, the transparent layer 150, the second adhesive layer 420, the polarizer 300, the touch screen panel 200, the third adhesive layer 430, the display panel 100, the first adhesive layer 410, and the sensor 700.

The configuration disclosed in FIG. 4 differs from the configuration disclosed in FIG. 3 in terms of only the position in which the sensor 700 is mounted in the opening 800. Therefore, detailed descriptions of the same components will be omitted.

According to various embodiments, the opening 800 may further extend through at least parts of the first adhesive layer 410, the display panel 100, the third adhesive layer 430, and the touch screen panel 200. The sensor 700 may be mounted in the opening 800 formed up to the touch screen panel 200. In this case, although the opening 800 further extends through the touch screen panel 200, the opening 800 may not be formed through the polarizer 300.

According to various embodiments, the thin film encapsulation layer may be included at opposite ends of the opening 800 of the display panel 100. In this case, the one or more sponges 730 may preferably be mounted between the sensor 700 and the thin film encapsulation layer, which is formed at the opposite ends of the display panel 100, to prevent infiltration of dust into the lens of the sensor 700 and absorb shock applied from the outside to the sensor 700.

Although it has been described that the thin film encapsulation layer (140 of FIG. 5) is formed at the opposite ends of the opening 800 of the display panel 100, the thin film encapsulation layer (140 of FIG. 5) may not be formed at the opposite ends of the opening 800 of the display panel 100, and the one or more sponges 730 may be mounted at the opposite ends of the opening 800 of the display panel 100 as will be described below.

According to various embodiments, although it has been exemplified in the configuration illustrated in FIG. 4 that the opening 800 is formed up to the touch screen panel 200, the opening 800 may further extend through the polarizer 300.

Hereinafter, structures of the display panel 100 of the display 10 for mounting the sensor 700 in the active area 220 will be described with reference to FIGS. 5 to 10. In the following description of FIGS. 5 to 10, the direction in which the thin film encapsulation layer 140 is located is referred to as the upper direction, and the direction in which the polymer layer 110 is located is referred to as the lower direction.

Figure 5:
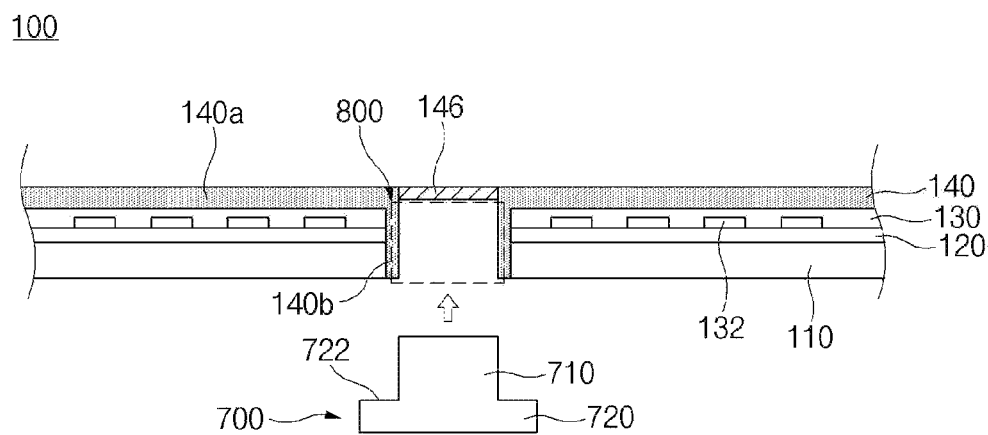
FIG. 5 is a sectional view of a display panel according to various embodiments.
Figure 6:
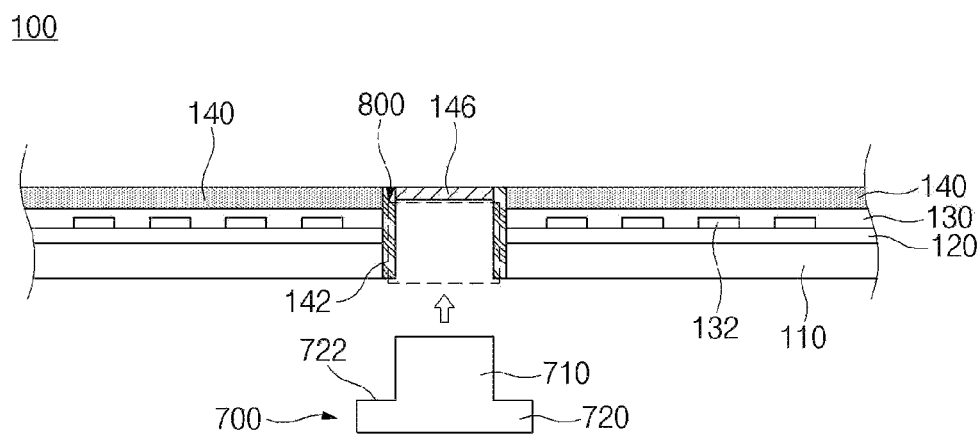
FIG. 6 is a sectional view of a display panel according to various embodiments.

FIG. 5 is a sectional view of the display panel 100 according to various embodiments. FIG. 6 is a sectional view of the display panel 100 according to various embodiments.

According to various embodiments, the display panel 100 may include a display substrate layer, a thin film transistor (TFT) array 120, an organic light emitting layer 130, and the thin film encapsulation layer 140.

The display substrate layer may be a base layer that forms the base of the display panel. The display substrate layer may be formed of, but is not limited to, a polymer material having flexibility. Hereinafter, the display substrate layer in this disclosure may be referred to as the polymer layer 110. As described above with reference to FIGS. 3 and 4, the opening 800 for mounting the sensor 700 may be formed through the display panel 100.

Specifically, the opening 800 may be formed through the thin film encapsulation layer 140, the organic light emitting layer 130, the thin film transistor array 120, and the polymer layer 110. The sensor 700 may be mounted in the opening 800.

The polymer layer 110 may be formed of a flexible material. The thin film transistor array 120 may be disposed over the polymer layer 110, and the first adhesive layer 410 illustrated in FIGS. 3 and 4 may be bonded to the bottom of the polymer layer 110.

The polymer layer 110 may include a first polymer layer and a second polymer layer disposed under the first polymer layer.

According to various embodiments, the first polymer layer and the second polymer layer may contain at least one of polyethyleneterephthalate, polymethylmethacrylate, polyamide, polyimide, polypropylene, or polyurethane.

According to various embodiments, the first polymer layer may be formed of polyimide that is a flexible material.

According to various embodiments, the second polymer layer for supporting the first polymer layer may be formed of polyethyleneterephthalate. According to various embodiments, the thin film transistor array 120 may be disposed over the polymer layer 110. The thin film transistor array may include a plurality of transistors formed in a thin film form. The thin film transistor array 120 may be electrically connected to the pixels included in the active area of the display panel 100 and may drive the pixels.

The organic light emitting layer 130 having a plurality of pixels 132 formed therein may be formed on an upper surface of the thin film transistor array 120. The pixels 132 may each include sub-pixels. The sub-pixels may be implemented with light emitting elements. The light emitting elements may include organic light emitting diodes containing organic materials.

According to various embodiments, the organic light emitting layer 130, which emits light by itself when receiving electricity through electrodes, may contain red, green, and blue fluorescent substances or phosphorus organic compounds. The organic light emitting layer 130 may not at least partially overlap the opening 800 when the front part of the housing 22 illustrated in FIG. 2 is viewed from above.

According various embodiments, the organic light emitting layer 130 may include a cathode electrode, an anode electrode, and organic light emitting diodes and may be deposited on the thin film transistor array 120.

The organic light emitting layer 130 may be disposed to face toward the transparent layer 150 illustrated in FIG. 3.

The pixels 132 formed in the organic light emitting layer 130 may be vulnerable to external oxygen or moisture.

Accordingly, the display 10 according to various embodiments may include the thin film encapsulation layer 140 for interrupting exposure of the pixels 132 and the organic light emitting layer 130 to the external oxygen or moisture. For planarization of the thin film encapsulation layer 140, a buffer layer may be additionally provided over the thin film encapsulation layer 140.

According various embodiments, the thin film transistor array 120 may be a buffer layer. The buffer layer may prevent infiltration of tramp elements into the polymer layer 110 and may provide a flat surface on the top of the polymer layer 110. The thin film transistor array 120, which is a buffer layer, may be formed of various materials capable of providing a flat surface. For example, the buffer layer may contain glass, a synthetic resin (PET), an inorganic material such as silicon oxide, silicon nitride, silicon oxy-nitride, aluminum oxide, aluminum nitride, titanium oxide, titanium nitride, or the like, or an organic material such as polyimide, polyester, acryl, or the like. The buffer layer may be deposited by various deposition methods such as a plasma enhanced chemical vapor deposition (PECVD) method, an atmospheric pressure CVD (APCVD) method, a low pressure CVD (LPCVD) method, and the like.

As illustrated in FIG. 5, the thin film encapsulation layer 140 may include a first encapsulation portion 140a formed on the organic light emitting layer 130 to cover the organic light emitting layer 130 and a second encapsulation portion 140b extending from the first encapsulation portion 140a into the opening 800.

Meanwhile, a sealing member 142 may be further included as illustrated in FIG. 6. The sealing member 142 may be formed inside the opening 800. An upper end portion of the sealing member 142 may be connected to the thin film encapsulation layer 140. The thin film encapsulation layer 140 may include a plurality of layers. For example, the thin film encapsulation layer 140 may include a first layer formed on the organic light emitting layer 130 and a second layer formed on the first layer. The first layer may be formed of an inorganic material and/or an organic material, and the second layer may be formed of an inorganic material.

According to various embodiments, the thin film encapsulation layer 140 may include at least one layer among an organic layer, an inorganic layer, an organic metal layer, and/or a silicate layer, and may cover the organic light emitting layer 130. The thin film encapsulation layer 140 may prevent the organic light emitting layer 130 from being oxidized by moisture and oxygen. The thin film encapsulation layer 140 may have a structure in which one or more organic layers and one or more inorganic layers are alternately stacked.

In a case where a plurality of organic layers and inorganic layers are alternately stacked, the uppermost layer may be formed of an inorganic layer to more effectively prevent infiltration of moisture into the organic light emitting layer 130.

According to various embodiments, the organic layer may contain aluminum tris 8-hydroxyquinoline, phthalocyanines, naphthalocyanines, polycyclic aromatics, or a compound thereof. The inorganic layer may contain laser induced fluorescence (LIF), magnesium fluoride (MgF2), calcium fluoride (CaF2), or a compound thereof.

According to various embodiments, the thin film encapsulation layer 140 may further include a functional layer, in addition to at least one layer among the organic layer, the inorganic layer, the organic metal layer, and/or the silicate layer. The functional layer may include at least one of hardcoat layers, photoresist layers, antiglare layers, antireflective layers, and impact protective coatings. The functional layer may contain at least one of an etch resistant material, siloxanes, hexafluorobenzene, pentafluorostyrene, perfluoro-1, 3-butadiene, chlorocarbon compounds, and thermoplastic polymers. The etch resistant material may include at least one of antismear/fingerprint coatings and silanes.

In a case where the opening 800 for mounting the sensor 700 is formed in the organic light emitting layer 130 and the thin film transistor array 120, the pixels 132, the light emitting elements, or the electrodes of the organic light emitting layer 130 and the thin film transistor array 120 may be exposed to the outside through inner sidewalls of the organic light emitting layer 130 and the thin film transistor array 120, which are formed by the opening 800, despite the first encapsulation portion 140a.

According to various embodiments, a method for preventing organic light emitting materials contained in the organic light emitting layer 130 from being exposed to external moisture or oxygen may be considered.

The display panel 100 according to various embodiments may include the second encapsulation portion 140b extending into the opening 800. The second encapsulation portion 140b may be understood as being formed of the same material as the first encapsulation portion 140a and extending from the first encapsulation portion 140a.

As illustrated in FIG. 5, the second encapsulation portion 140b may extend from the top of the opening 800 to the bottom thereof. The second encapsulation portion 140b may be formed of a film member formed on an inner surface of the opening 800. The second encapsulation portion 140b may be formed to extend from the first encapsulation portion 140a to the inner surface of the opening 800 and cover the inner sidewall of the organic light emitting layer 130 and the inner sidewall of the thin film transistor array 120.

Furthermore, the second encapsulation portion 140b may be formed to further extend along a lower side of the opening 800 and cover at least part of the second encapsulation portion 140b of the polymer layer 110. Alternatively, the second encapsulation portion 140b may be formed to cover the entire inner sidewall of each layer.

According to various embodiments, the polymer layer 110 disposed outside the opening 800 may be covered by the second encapsulation portion 140b that the thin film encapsulation layer 140 extends to form.

In various embodiments, the opening 800 may be formed through at least some of the organic light emitting layer 130, the thin film transistor array 120, and the polymer layer 110. The sensor 700 may be inserted in a direction toward a second portion through a first portion. The first portion may be sealed by the transparent layer 150. The opening 800 may have a circular cross-section. Without being limited thereto, however, the opening 800 may have cross-sections in various shapes.

According to the embodiment illustrated in FIG. 5, it is exemplified that there is no space between the sensor 700 and the second encapsulation portion 140b. However, the disclosure is not limited thereto. The sensor 700 and the second encapsulation portion 140b may be spaced apart from each other at a predetermined interval, and a predetermined space may be formed between the sensor 700 and the second encapsulation portion 140b.

In various embodiments illustrated in FIG. 6, the sealing member 142 may be formed separately from the thin film encapsulation layer 140. The sealing member 142 may have a film form that is formed on an inner sidewall of the opening 800. Alternatively, the sealing member 142 may be a filler that fills the space between the inner sidewall of the opening 800 and the sensor 700. The filler may contain a curable material such as epoxy or resin.

The inner sidewall of the opening 800 may include the first portion formed in the polymer layer 1100 and the second portion formed in the remaining inner sidewalls. The sealing member 142 may be formed to cover the second portion and at least part of the first portion. Alternatively, the sealing member 142 may be inserted between the second portion and the sensor 700 and between the at least part of the first portion and the sensor 700.

The sensor 700 may include an insert portion 710 inserted into the opening 800 and a support portion 720 extending from the insert portion 710. As illustrated in FIGS. 5 and 6, the insert portion 710 may be formed to have a diameter, a size, or a cross-sectional area by which the insert portion 710 is able to be inserted into the opening 800 through the first portion.

The support portion 720 may be formed to have a larger cross-sectional area than the insert portion 710. The support portion 720 may be formed so as not to be inserted into the opening 800. Unlike the insert portion 710, the support portion 720 may be disposed outside the opening 800. The support portion 720 may be formed to have a larger diameter or cross-sectional area than the opening 800 and may not be inserted into the opening 800.

The support portion 720 may be formed on an internal substrate of the electronic device 20 and may support the insert portion 710. Furthermore, referring to FIGS. 5 and 6, the support portion 720 may include a support surface 722 formed such that at least part thereof makes contact with a lower surface of the polymer layer 110. The support surface 722 may be formed to seal the first portion of the opening 800, that is, the first portion formed on the lower surface of the polymer layer 110.

As described above, the second encapsulation portion 140b may be formed inside the opening 800. In a case where the second encapsulation portion 140b extends to an area formed on the polymer layer 110, part of the second encapsulation portion 140b may be formed on the support surface 722. Alternatively, the second encapsulation portion 140b inside the opening 800 may be supported by the support surface 722.

According to the embodiment illustrated in FIG. 5, the display 10 may include the first encapsulation portion 140a that covers an upper surface of the organic light emitting layer 130 and the second encapsulation portion 140b extending from the first encapsulation portion 140a into the opening 800. In particular, the second encapsulation portion 140b may cover the organic light emitting layer 130 and the thin film transistor array 120 exposed to the outside through the opening 800, thereby preventing the organic light emitting layer 130 and the display 10 from being faulty or damaged, and extending the lifetimes thereof.

Furthermore, according to the embodiment illustrated in FIG. 6, the thin film encapsulation layer 140 covering the organic light emitting layer 130 and the separate sealing member 142 formed in the opening may cover the organic light emitting layer 130 and the thin film transistor array layer 120 that may be exposed to the outside, thereby preventing the organic light emitting layer 130 and the display 10 from being faulty or damaged, and extending the lifetimes thereof.

Figure 7:
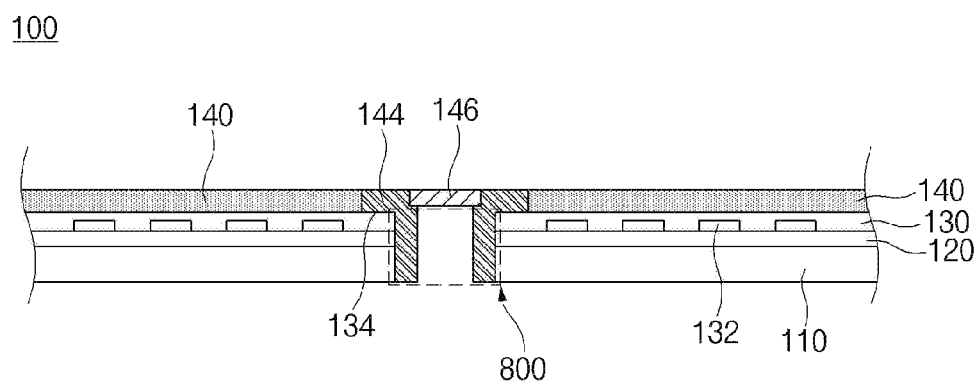
FIG. 7 is a sectional view of a display panel according to various embodiments.
Figure 8:
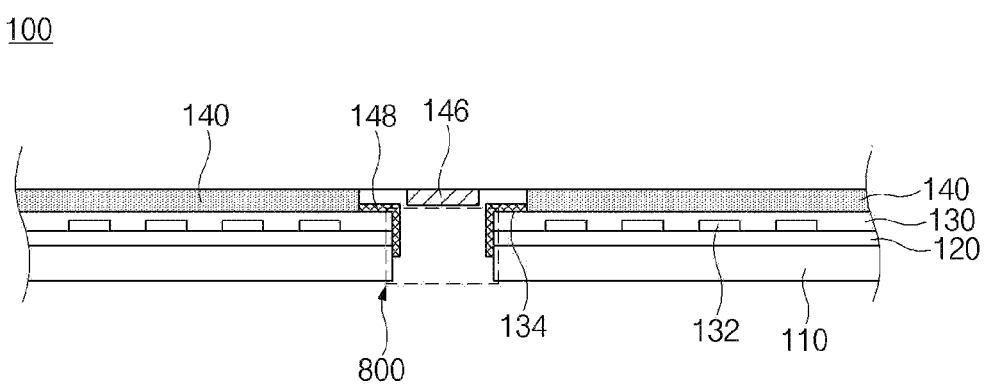
FIG. 8 is a sectional view of a display panel according to various embodiments.

FIG. 7 is a sectional view of the display panel 100 according to various embodiments. FIG. 8 is a sectional view of the display panel 100 according to various embodiments.

The display panel 100 according to various embodiments may include, from a lower side, the polymer layer 110, the thin film transistor array 120 formed on the upper surface of the polymer layer 110, the organic light emitting layer 130 formed on the upper surface of the thin film transistor array 120, and the thin film encapsulation layer 140 formed on the organic light emitting layer 130.

Furthermore, the opening 800 for mounting the sensor 700 may be formed through the organic light emitting layer 130, the thin film transistor array 120, and the polymer layer 110, and the sensor 700 and a filler 144 or a blocking film 148 may be disposed inside the opening 800. The filler 144 may contain epoxy, a resin, or a material similar thereto.

The organic light emitting layer 130, the thin film transistor array 120, the opening 800, and the sensor 700 are the same as described above, and therefore descriptions thereabout will be omitted.

The thin film encapsulation layer 140 may be formed on the upper surface of the organic light emitting layer 130 and may include the sealing member 142 disposed inside the opening 800. In this case, the sealing member 142 may include the filler 144 or the blocking film 148.

The thin film encapsulation layer 140 of the display 10 illustrated in FIGS. 7 and 8 may be formed to cover at least part of the organic light emitting layer 130. The thin film encapsulation layer 140 may be referred to as the thin film encapsulation layer or the thin film encapsulation film.

Unlike in the embodiments illustrated in FIGS. 5 and 6, the thin film encapsulation layer 140 may not be formed in an area adjacent to the opening 800 of the organic light emitting layer 130.

The organic light emitting layer 130 may include an encapsulated area that is encapsulated by the thin film encapsulation layer 140 and an exposed area that is not encapsulated by the thin film encapsulation layer. The exposed area may refer to an area extending from the encapsulated area in a direction toward the center of the opening 800.

The exposed area may include a first step surface 134 formed on the upper surface of the organic light emitting layer 130 and an inner sidewall of the organic light emitting layer 130 that is formed by the opening 800.

In this case, the exposed area of the organic light emitting layer 130 may be exposed to external oxygen or moisture. Furthermore, the inner sidewall of the organic light emitting layer 130 may be exposed to external oxygen or moisture by a section of the opening 800 formed through the organic light emitting layer 130.

To prevent this, the embodiments illustrated in FIGS. 7 and 8 may include the sealing member 142 formed inside the hole. The sealing member 142 may include the filler 144 or the blocking film 148.

Referring to FIG. 7, the filler 144 may be formed inside the opening 800. The filler 144 may be disposed between the inner surface of the opening 800 and the sensor 700 disposed inside the opening 800. The filler 144 may be received in the opening 800. The support surface 722 of the sensor 700 may be formed on the second portion of the opening 800, and the filler 144 received in the opening 800 may be supported by the support surface.

Referring to FIG. 8, the opening 800 may include a first step portion including the first step surface 134 formed by the organic light emitting layer 130 and the thin film encapsulation layer 140. Because the thin film encapsulation layer 140 is not formed in the exposed area formed on the organic light emitting layer 130, the thin film encapsulation layer 140 and the organic light emitting layer 130 may be formed to have a step.

Due to this structure, the first step surface 134 and the inner sidewall of the organic light emitting layer 130 may be exposed to external oxygen and moisture. Accordingly, the blocking film 148 formed to cove the exposed area may be included.

The blocking film 148 may be formed of a film member containing metal and/or an inorganic material. The blocking film 148 may be formed to cover at least the first step surface 134 of the upper surface of the organic light emitting layer 130, on which the thin film encapsulation layer 140 is not formed, and the inner sidewall of the organic light emitting layer 130. Furthermore, the blocking film 148 may further extend along the direction toward the bottom of the opening 800 and may extend up to the opening 800 formed in the polymer layer 110.

Referring to FIGS. 7 and 8, in various embodiments, the display 10 may include a moisture barrier 146 disposed over the sensor 700. The moisture barrier 146 may prevent moisture introduced through the transparent layer 150 from infiltrating into the organic light emitting layer 130.

In various embodiments, the moisture barrier 146 may be formed to be transparent and may be formed to cover the top of the sensor 700.

In this case, the moisture barrier 146 may further extend from the top of the sensor 700 in the radially outward direction of the sensor 700 and may cover the entire top side of the opening 800. Furthermore, the moisture barrier 146 may extend to the first step surface 134 formed on the organic light emitting layer 130, or may extend to the blocking film 148 formed on the first step surface 134.

In various embodiments, the moisture barrier 146 may be formed along the outer periphery of the top of the sensor 700. In this case, the moisture barrier 146 may be formed to be opaque, and an air layer may be formed inside the moisture barrier 146, or a transparent member may be inserted into the moisture barrier 146.

Figure 9:
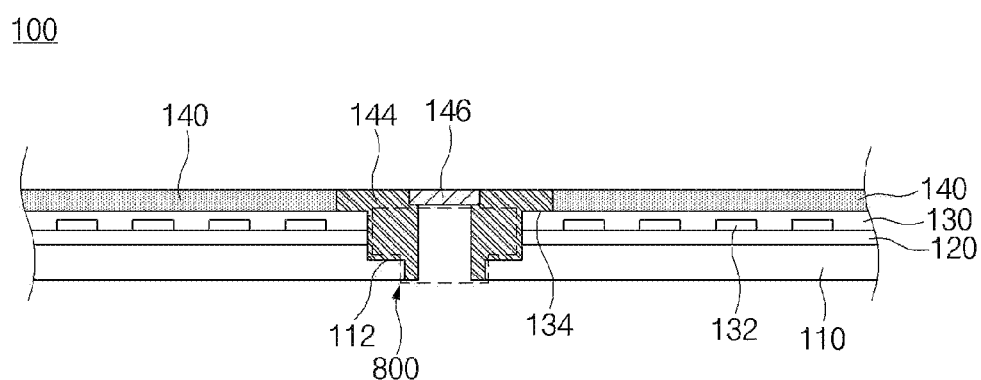
FIG. 9 is a sectional view of a display panel according to various embodiments.
Figure 10:
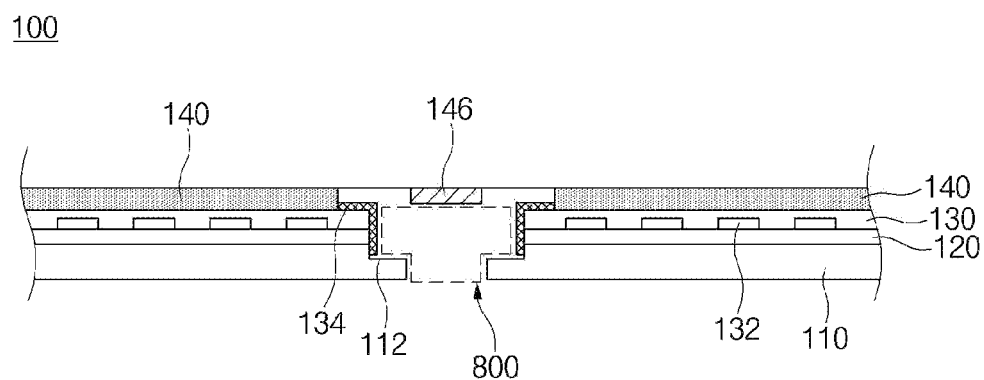
FIG. 10 is a sectional view of a display panel according to various embodiments.

FIG. 9 is a sectional view of the display panel 100 according to various embodiments. FIG. 10 is a sectional view of the display panel 100 according to various embodiments.

In various embodiments, the opening 800 may include at least one step portion. As described above, the first step portion may be formed by the organic light emitting layer 130 and the thin film encapsulation layer 140. The first step portion may include the first step surface 134, and the first step surface 134 may be formed toward the front part of the housing 22.

A second step portion may be formed on the polymer layer 110. The polymer layer 110 may include a protrusion, part of which protrudes toward the center of the opening 800. The protrusion may include a lower surface of the polymer layer 110. The second step portion may include a second step surface 112 formed on the protrusion, and the second step surface 112 may be formed toward the front part of the housing 22.

In various embodiments, the thin film encapsulation layer 140 may be disposed over the organic light emitting layer 130. Furthermore, the sealing member 142 may be formed inside the opening 800. The sealing member 142 may include the filler 144 or the blocking film 148.

As illustrated in FIG. 9, the blocking film 148 may be formed on the first step portion. The blocking film 148 may be formed to cover the first step surface 134, the inner sidewall of the organic light emitting layer 130, and the inner sidewall of the thin film transistor array 120. The blocking layer 148 may further extend downward along the inner surface of the opening 800 and may cover at least part of the inner sidewall of the polymer layer 110.

As illustrated in FIG. 10, the filler 144 may be disposed inside the opening 800. The filler 144 may be received in the opening 800. The support surface 722 formed on the support portion 720 of the sensor 700 may be formed in the second portion of the opening 800 and may support the bottom of the filler 144 in the opening 800.

Figure 11:
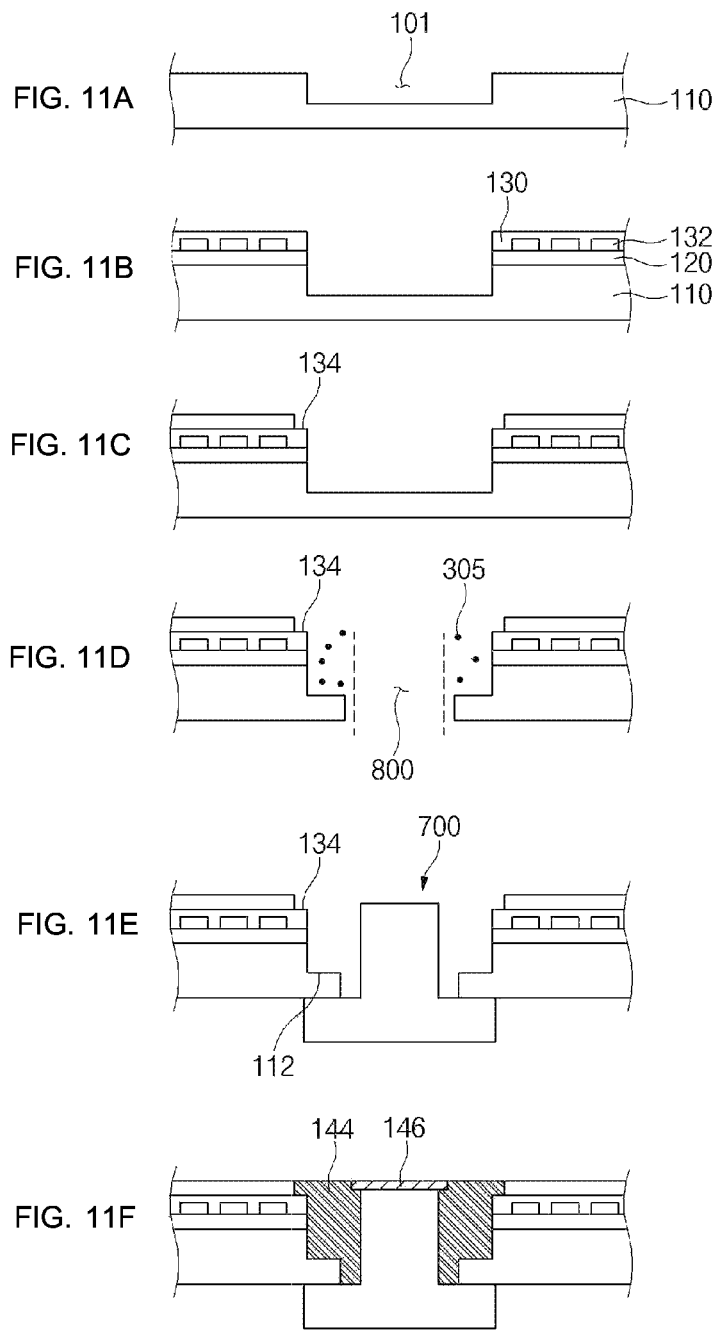
FIGS. 11A, 11B, 11C, 11D, 11E, and 11F are views illustrating a method for manufacturing a display panel according to various embodiments.

FIG. 11 illustrates a method for manufacturing the display 10 according to various embodiments.

Hereinafter, the method for manufacturing the display 10 according to various embodiments will be described with reference to FIG. 11.

First, a recess 101 may be formed on the polymer layer 110. The recess 101 may be formed by using a laser in the same way as laser etching or laser cutting. The recess 101 may be formed on a partial area of the polymer layer 110 that corresponds to an area in which the sensor 700 is to be mounted.

Next, the thin film transistor array 120 may be stacked on the polymer layer 110. A hole corresponding to the recess 101 formed on the polymer layer 110 may be formed in the thin film transistor array 120. The plurality of pixels 132 may be formed and arranged on the upper surface of the thin film transistor array 120. The plurality of pixels 132 may be implemented with various types of light emitting elements including OLED elements.

After the stack of the thin film transistor array 120, the organic light emitting layer 130 may be stacked on one surface of the thin film transistor array 120. Likewise to the thin film transistor array 120, the organic light emitting layer 130 may have an opening corresponding to the recess 101 formed on the polymer layer 110. The organic light emitting layer 130 may include a cathode element electrically connected with the pixels 132.

Then, the thin film encapsulation layer 140 may be formed on the upper surface of the organic light emitting layer 130. The thin film encapsulation layer 140 may be formed to cover part of the organic light emitting layer 130. The thin film encapsulation layer 140 may not be formed on an area of the upper surface of the organic light emitting layer 130 that is adjacent to the hole. Accordingly, the first step portion including the first step surface 134 formed to face upward may be formed on the organic light emitting layer 130.

After that, the sensor mounting hole 800 for mounting the sensor 700 may be formed in the polymer layer 110. The sensor mounting hole 800 may be formed by laser cutting in the same way that the recess 101 is formed on the polymer layer 110.

In a case of performing laser cutting on the polymer layer 110, the second step portion including the second step surface 112 may be formed. Likewise to the first step surface 134, the second step surface 112 may be formed to face toward the front part of the housing that is located on an upper side thereof.

At this time, foreign matter 305 generated from the polymer layer 110 may be scattered. The first step portion may prevent the foreign matter 305 from being scattered to the active area. The foreign matter 305 may be left on the second step surface 112 by the first step portion without being scattered to the active area.

Thereafter, the foreign matter 305 left on the second step surface 112 around the sensor mounting hole 303 may be removed.

After that, the sensor 700 may be mounted in the sensor mounting hole 800. Part of the sensor 700 may be inserted into the sensor mounting hole 800, and the rest may be located outside the sensor mounting hole 800.

After the sensor 700 is inserted, the filler 144 may be received in the sensor mounting hole 800, the recess 101 formed on the polymer layer 110, and the holes formed in the thin film transistor array 120 and the organic light emitting layer 130. The filler 144 may prevent the organic light emitting layer 130 and the thin film transistor array 120 exposed to the outside from being exposed to oxygen and moisture.

After the filler 144 is received, the moisture barrier 146 may be disposed on the upper surface of the sensor 700. The moisture barrier 146 may block a path along which moisture infiltrates.

In the case of manufacturing the display 10 as described above, the foreign matter 305 generated when the sensor mounting hole 800 is formed by the cutting may be prevented from being scattered to the active area. Accordingly, even in the case where the sensor 700 is mounted in the display 10, the display 10 having no defect in the active area, and the electronic device may be provided. Furthermore, as the filler 144 is disposed in the sensor mounting hole 800 and the moisture barrier 146 is disposed on the sensor 700, the display 10 and the electronic device that have a low defect rate and high reliability may be provided.

FIG. 12 is a block diagram of an electronic device 1201 in a network environment 1200 according to various embodiments. Referring to FIG. 12, the electronic device 1201 (e.g., the electronic device 100 in FIG. 1) may communicate with an electronic device 1202 through a first network 1298 (e.g., a short-range wireless communication network) or may communicate with an electronic device 1204 or a server 1208 through a second network 1299 (e.g., a long-distance wireless communication network) in the network environment 1200. According to an embodiment, the electronic device 1201 may communicate with the electronic device 1204 through the server 1208. According to an embodiment, the electronic device 1201 may include a processor 1220, a memory 1230, an input device 1250, a sound output device 1255, a display device 1260, an audio module 1270, a sensor module 1276, an interface 1277, a haptic module 1279, a camera module 1280, a power management module 1288, a battery 1289, a communication module 1290, a subscriber identification module 1296, or an antenna module 1297. According to some embodiments, at least one (e.g., the display device 1260 or the camera module 1280) among components of the electronic device 1201 may be omitted or one or more other components may be added to the electronic device 1201. According to some embodiments, some of the above components may be implemented with one integrated circuit. For example, the sensor module 1276 (e.g., a fingerprint sensor, an iris sensor, or an illuminance sensor) may be embedded in the display device 1260 (e.g., a display).

The processor 1220 may execute, for example, software (e.g., a program 1240) to control at least one of other components (e.g., a hardware or software component) of the electronic device 1201 connected to the processor 1220 and may process or compute a variety of data. According to an embodiment, as a part of data processing or operation, the processor 1220 may load a command set or data, which is received from other components (e.g., the sensor module 1276 or the communication module 1290), into a volatile memory 1232, may process the command or data loaded into the volatile memory 1232, and may store result data into a nonvolatile memory 1234. According to an embodiment, the processor 1220 may include a main processor 1221 (e.g., a central processing unit or an application processor) and an auxiliary processor 1223 (e.g., a graphic processing device, an image signal processor, a sensor hub processor, or a communication processor), which operates independently from the main processor 1221 or with the main processor 1221. Additionally or alternatively, the auxiliary processor 1223 may use less power than the main processor 1221, or is specified to a designated function. The auxiliary processor 1223 may be implemented separately from the main processor 1221 or as a part thereof.

The auxiliary processor 1223 may control, for example, at least some of functions or states associated with at least one component (e.g., the display device 1260, the sensor module 1276, or the communication module 1290) among the components of the electronic device 1201 instead of the main processor 1221 while the main processor 1221 is in an inactive (e.g., sleep) state or together with the main processor 1221 while the main processor 1221 is in an active (e.g., an application execution) state. According to an embodiment, the auxiliary processor 1223 (e.g., the image signal processor or the communication processor) may be implemented as a part of another component (e.g., the camera module 1280 or the communication module 1290) that is functionally related to the auxiliary processor 1223.

The memory 1230 may store a variety of data used by at least one component (e.g., the processor 1220 or the sensor module 1276) of the electronic device 1201. For example, data may include software (e.g., the program 1240) and input data or output data with respect to commands associated with the software. The memory 1230 may include the volatile memory 1232 or the nonvolatile memory 1234.

The program 1240 may be stored in the memory 1230 as software and may include, for example, an operating system 1242, a middleware 1244, or an application 1246.

The input device 1250 may receive a command or data, which is used for a component (e.g., the processor 1220) of the electronic device 1201, from an outside (e.g., a user) of the electronic device 1201. The input device 1250 may include, for example, a microphone, a mouse, a keyboard, or a digital pen (e.g., a stylus pen).

The sound output device 1255 may output a sound signal to the outside of the electronic device 1201. The sound output device 1255 may include, for example, a speaker or a receiver. The speaker may be used for general purposes, such as multimedia play or recordings play, and the receiver may be used for receiving calls. According to an embodiment, the receiver and the speaker may be either integrally or separately implemented.

The display device 1260 may visually provide information to the outside (e.g., the user) of the electronic device 1201. For example, the display device 1260 may include a display, a hologram device, or a projector and a control circuit for controlling a corresponding device. According to an embodiment, the display device 1260 may include a touch circuitry configured to sense the touch or a sensor circuit (e.g., a pressure sensor) for measuring an intensity of pressure on the touch.

The audio module 1270 may convert a sound and an electrical signal in dual directions. According to an embodiment, the audio module 1270 may obtain the sound through the input device 1250 or may output the sound through the sound output device 1255 or an external electronic device (e.g., the electronic device 1202 (e.g., a speaker or a headphone)) directly or wirelessly connected to the electronic device 1201.

The sensor module 1276 may generate an electrical signal or a data value corresponding to an operating state (e.g., power or temperature) inside or an environmental state (e.g., a user state) outside the electronic device 1201. According to an embodiment, the sensor module 1276 may include, for example, a gesture sensor, a gyro sensor, a barometric pressure sensor, a magnetic sensor, an acceleration sensor, a grip sensor, a proximity sensor, a color sensor, an infrared sensor, a biometric sensor, a temperature sensor, a humidity sensor, or an illuminance sensor.

The interface 1277 may support one or more designated protocols to allow the electronic device 1201 to connect directly or wirelessly to the external electronic device (e.g., the electronic device 1202). According to an embodiment, the interface 1277 may include, for example, an HDMI (high-definition multimedia interface), a USB (universal serial bus) interface, an SD card interface, or an audio interface.

A connecting terminal 1278 may include a connector that physically connects the electronic device 1201 to the external electronic device (e.g., the electronic device 1202). According to an embodiment, the connecting terminal 1278 may include, for example, an HDMI connector, a USB connector, an SD card connector, or an audio connector (e.g., a headphone connector).

The haptic module 1279 may convert an electrical signal to a mechanical stimulation (e.g., vibration or movement) or an electrical stimulation perceived by the user through tactile or kinesthetic sensations. According to an embodiment, the haptic module 1279 may include, for example, a motor, a piezoelectric element, or an electric stimulator.

The camera module 1280 may shoot a still image or a video image. According to an embodiment, the camera module 1280 may include, for example, at least one or more lenses, image sensors, image signal processors, or flashes.

The power management module 1288 may manage power supplied to the electronic device 1201. According to an embodiment, the power management module 1288 may be implemented as at least a part of a power management integrated circuit (PMIC).

The battery 1289 may supply power to at least one component of the electronic device 1201. According to an embodiment, the battery 1289 may include, for example, a non-rechargeable (primary) battery, a rechargeable (secondary) battery, or a fuel cell.

The communication module 1290 may establish a direct (e.g., wired) or wireless communication channel between the electronic device 1201 and the external electronic device (e.g., the electronic device 1202, the electronic device 1204, or the server 1208) and support communication execution through the established communication channel. The communication module 1290 may include at least one communication processor operating independently from the processor 1220 (e.g., the application processor) and supporting the direct (e.g., wired) communication or the wireless communication. According to an embodiment, the communication module 1290 may include a wireless communication module 1292 (e.g., a cellular communication module, a short-range wireless communication module, or a GNSS (global navigation satellite system) communication module) or a wired communication module 1294 (e.g., an LAN (local area network) communication module or a power line communication module). The corresponding communication module among the above communication modules may communicate with the external electronic device through the first network 1298 (e.g., the short-range communication network such as a Bluetooth, a WiFi direct, or an IrDA (infrared data association)) or the second network 1299 (e.g., the long-distance wireless communication network such as a cellular network, an internet, or a computer network (e.g., LAN or WAN)). The above-mentioned various communication modules may be implemented into one component (e.g., a single chip) or into separate components (e.g., chips), respectively. The wireless communication module 1292 may identify and authenticate the electronic device 1201 using user information (e.g., international mobile subscriber identity (IMSI)) stored in the subscriber identification module 1296 in the communication network, such as the first network 1298 or the second network 1299.

The antenna module 1297 may transmit or receive a signal or power to or from the outside (e.g., an external electronic device). According to an embodiment, the antenna module 1297 may include one or more antennas. For example, the communication module 1290 may select one antenna suitable for a communication method used in the communication network such as the first network 1298 or the second network 1299. The signal or power may be transmitted or received between the communication module 1290 and the external electronic device through the selected one antenna.

At least some components among the components may be connected to each other through a communication method (e.g., a bus, a GPIO (general purpose input and output), an SPI (serial peripheral interface), or an MIPI (mobile industry processor interface)) used between peripheral devices to exchange signals (e.g., a command or data) with each other.

According to an embodiment, the command or data may be transmitted or received between the electronic device 1201 and the external electronic device 1204 through the server 1208 connected to the second network 1299. Each of the electronic devices 1202 and 1204 may be the same or different types as or from the electronic device 1201. According to an embodiment, all or some of the operations performed by the electronic device 1201 may be performed by one or more external electronic devices among the external electronic devices 1202, 1204, or 1208. For example, when the electronic device 1201 performs some functions or services automatically or by request from a user or another device, the electronic device 1201 may request one or more external electronic devices to perform at least some of the functions related to the functions or services, in addition to or instead of performing the functions or services by itself. The one or more external electronic devices receiving the request may carry out at least a part of the requested function or service or the additional function or service associated with the request and transmit the execution result to the electronic device 1201. The electronic device 1201 may provide the result as is or after additional processing as at least a part of the response to the request. To this end, for example, a cloud computing, distributed computing, or client-server computing technology may be used.

Figure 13:
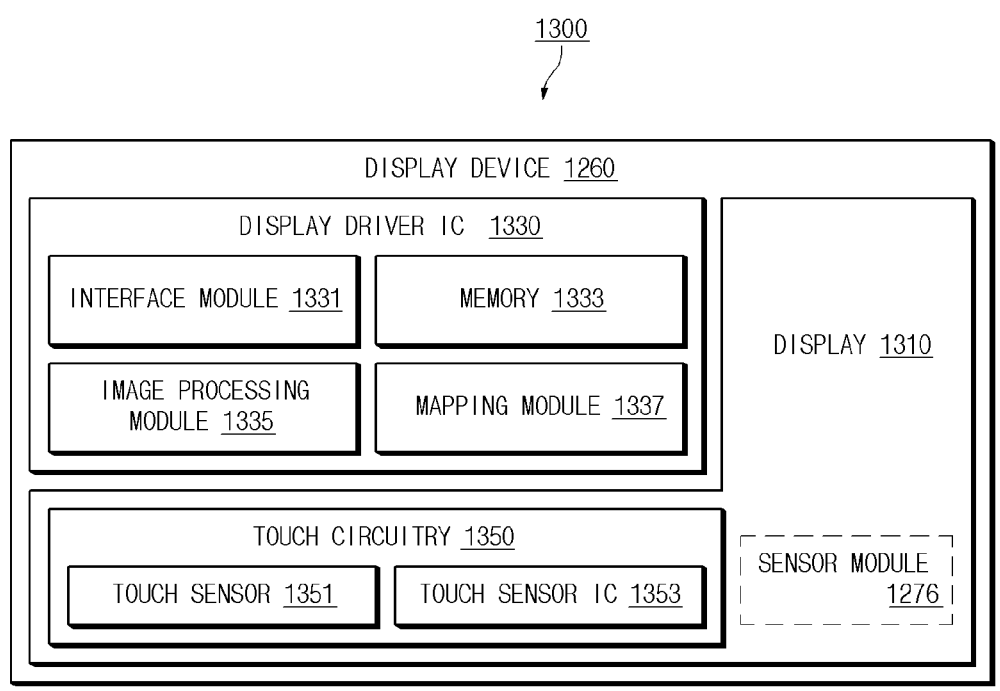
FIG. 13 is a block diagram of a display including an opening for mounting a sensor, according to various embodiments.

FIG. 13 is a block diagram 1300 of the display device 1260 according to various embodiments. Referring to FIG. 13, the display device 1260 may include a display 1310 and a display driver IC (DDI) 1330 for controlling the display 1310. The DDI 1330 may include an interface module 1331, a memory 1333 (e.g., a buffer memory), an image processing module 1335, or a mapping module 1337. The DDI 1330 may receive, for example, image data or image information including an image control signal corresponding to an instruction for controlling the image data, from another component of the electronic device 1201 through the interface module 1331. For example, according to an embodiment, the image information may be received from the processor 1220 (e.g., the main processor 1221 (e.g., an application processor) or the auxiliary processor 1223 (e.g., a graphic processing device) that operates independently of a function of the main processor 1221). The DDI 1330 may communicate with touch circuitry 1350, the sensor module 1276, or the like through the interface module 1331. Furthermore, the DDI 1330 may store at least part of the received image information in the memory 1333, for example, on a frame-by-frame basis. The image processing module 1335, for example, may pre-process or post-process at least part of the image data (e.g., may adjust the resolution, brightness, or size thereof), based at least on characteristics of the image data or characteristics of the display 1310. The mapping module 1337 may generate a voltage value or a current value that corresponds to the image data pre-processed or post-processed through the image processing module 1235. According to an embodiment, the generation of the voltage value or the current value may be performed based at least partly on, for example, attributes of pixels of the display 1310 (e.g., an arrangement of the pixels (an RGB stripe or pentile structure) or the size of each of sub-pixels). At least some pixels of the display 1310 may be driven based at least partly on, for example, the voltage value or the current value, and therefore visual information (e.g., text, an image, or an icon) that corresponds to the image data may be displayed through the display 1310.

According to an embodiment, the display device 1260 may further include the touch circuitry 1350. The touch circuitry 1350 may include a touch sensor 1351 and a touch sensor IC 1353 for controlling the touch sensor 1351. The touch sensor IC 1353 may control the touch sensor 1351 to detect, for example, a touch input or a hovering input to a specific position of the display 1310. For example, the touch sensor IC 1353 may detect the touch input or the hovering input by measuring a change of a signal (e.g., voltage, an amount of light, resistance, or an amount of electric charge) for the specific position of the display 1310. The touch sensor IC 1353 may provide information (e.g., position, area, pressure, or time) regarding the detected touch input or hovering input to the processor 1220. According to an embodiment, at least a part (e.g., the touch sensor IC 1353) of the touch circuitry 1350 may be included as a part of the display driver IC 1330 or the display 1310 or a part of another component (e.g., the auxiliary processor 1223) that is disposed outside the display device 1260.

According to an embodiment, the display device 1260 may further include at least one sensor (e.g., a fingerprint sensor, an iris sensor, a pressure sensor, or an illuminance sensor) of the sensor module 1276 or control circuitry for the at least one sensor. In this case, the at least one sensor or the control circuitry for the same may be embedded in a part (e.g., the display 1310 or the DDI 1330) of the display device 1260 or a part of the touch circuitry 1350. For example, in a case where the sensor module 1276 embedded in the display device 1260 includes a biometric sensor (e.g., a fingerprint sensor), the biometric sensor may obtain biometric information (e.g., a fingerprint image) associated with a touch input, through a partial area of the display 1310. In another example, in a case where the sensor module 1276 embedded in the display device 1260 includes a pressure sensor, the pressure sensor may obtain pressure information associated with a touch input, through all or part of the display 1310. According to an embodiment, the touch sensor 1351 or the sensor module 1276 may be disposed between pixels in a pixel layer of the display 1310, or over or under the pixel layer.

The electronic device according to various embodiments disclosed in the disclosure may be various types of devices. The electronic device may include, for example, a portable communication device (e.g., a smartphone), a computer device, a portable multimedia device, a mobile medical appliance, a camera, a wearable device, or a home appliance. The electronic device according to an embodiment of the disclosure should not be limited to the above-mentioned devices.

It should be understood that various embodiments of the disclosure and terms used in the embodiments do not intend to limit technical features disclosed in the disclosure to the particular embodiment disclosed herein; rather, the disclosure should be construed to cover various modifications, equivalents, or alternatives of embodiments of the disclosure. With regard to description of drawings, similar or related components may be assigned with similar reference numerals. As used herein, singular forms of noun corresponding to an item may include one or more items unless the context clearly indicates otherwise. In the disclosure disclosed herein, each of the expressions "A or B", "at least one of A and B", "at least one of A or B", "A, B, or C", "one or more of A, B, and C", or "one or more of A, B, or C", and the like used herein may include any and all combinations of one or more of the associated listed items. The expressions, such as "a first", "a second", "the first", or "the second", may be used merely for the purpose of distinguishing a component from the other components, but do not limit the corresponding components in other aspect (e.g., the importance or the order). It is to be understood that if an element (e.g., a first element) is referred to, with or without the term "operatively" or "communicatively", as "coupled with," "coupled to," "connected with," or "connected to" another element (e.g., a second element), it means that the element may be coupled with the other element directly (e.g., wiredly), wirelessly, or via a third element.

The term "module" used in the disclosure may include a unit implemented in hardware, software, or firmware and may be interchangeably used with the terms "logic", "logical block", "part" and "circuit". The "module" may be a minimum unit of an integrated part or may be a part thereof. The "module" may be a minimum unit for performing one or more functions or a part thereof. For example, according to an embodiment, the "module" may include an application-specific integrated circuit (ASIC).

Various embodiments of the disclosure may be implemented by software (e.g., the program 1240) including an instruction stored in a machine-readable storage medium (e.g., an internal memory 1236 or an external memory 1238) readable by a machine (e.g., the electronic device 1201). For example, the processor (e.g., the processor 1220) of a machine (e.g., the electronic device 1201) may call the instruction from the machine-readable storage medium and execute the instructions thus called. This means that the machine may perform at least one function based on the called at least one instruction. The one or more instructions may include a code generated by a compiler or executable by an interpreter. The machine-readable storage medium may be provided in the form of non-transitory storage medium. Here, the term "non-transitory", as used herein, means that the storage medium is tangible, but does not include a signal (e.g., an electromagnetic wave). The term "non-transitory" does not differentiate a case where the data is permanently stored in the storage medium from a case where the data is temporally stored in the storage medium.

According to an embodiment, the method according to various embodiments disclosed in the disclosure may be provided as a part of a computer program product. The computer program product may be traded between a seller and a buyer as a product. The computer program product may be distributed in the form of machine-readable storage medium (e.g., a compact disc read only memory (CD-ROM)) or may be directly distributed (e.g., download or upload) online through an application store (e.g., a Play Store™) or between two user devices (e.g., the smartphones). In the case of online distribution, at least a portion of the computer program product may be temporarily stored or generated in a machine-readable storage medium such as a memory of a manufacturer's server, an application store's server, or a relay server.

According to various embodiments, each component (e.g., the module or the program) of the above-described components may include one or plural entities. According to various embodiments, at least one or more components of the above components or operations may be omitted, or one or more components or operations may be added. Alternatively or additionally, some components (e.g., the module or the program) may be integrated in one component. In this case, the integrated component may perform the same or similar functions performed by each corresponding components prior to the integration. According to various embodiments, operations performed by a module, a programming, or other components may be executed sequentially, in parallel, repeatedly, or in a heuristic method, or at least some operations may be executed in different sequences, omitted, or other operations may be added.

What is claimed is:

1. A display comprising:
    a display substrate layer;
    an organic light emitting layer formed over the display substrate layer, the organic light emitting layer including a plurality of pixels;
    a thin film transistor array layer disposed between the display substrate layer and the organic light emitting layer, the thin film transistor array layer including a plurality of thin film transistors electrically connected with the pixels;
    a thin film encapsulation layer formed on at least part of the organic light emitting layer;
    a sensor mount including an opening formed through the organic light emitting layer, the thin film transistor array layer, and the display substrate layer;
    a sensor disposed in the opening; and
    a seal formed in the opening for sealing the organic light emitting layer and the thin film transistor array layer from being exposed to the outside through an inner sidewall of the opening,
    wherein the opening includes a first portion formed in the display substrate layer and a second portion formed in a remainder of the opening, and
    wherein the seal is formed in the second portion and at least part of the first portion.

2. The display of claim 1, wherein the seal includes a filler disposed between the inner sidewall of the opening and the sensor, and the filler comprises epoxy and/or a resin.

3. The display of claim 1, wherein the organic light emitting layer includes an encapsulated area on which the thin film encapsulation layer is formed and an exposed area extending from the encapsulated area in a direction toward a center of the opening, and
    wherein the seal includes a blocking film formed to cover the exposed area.

4. The display of claim 3, wherein the exposed area includes a first step surface formed on one surface of the organic light emitting layer and an inner sidewall of the organic light emitting layer that is formed by the opening, and the blocking film comprises an inorganic material and/or a metallic material.

5. The display of claim 1, wherein the thin film encapsulation layer includes a first layer formed on the organic light emitting layer and a second layer formed on the first layer, and
    wherein the first layer comprises of an organic material and/or an inorganic material, and the second layer comprises an inorganic material.

6. The display of claim 1, wherein the display substrate layer comprises of a polymer layer including polyimide.

7. The display of claim 1, wherein the seal is connected with the thin film encapsulation layer.

8. The display of claim 1, wherein the seal extends from the thin film encapsulation layer.

9. The display of claim 8, wherein the seal and the thin film encapsulation layer comprise a same material.

10. The display of claim 9, wherein the seal further covers a part of the inner sidewall of the opening formed by the organic light emitting layer and the thin film transistor array layer.

11. The display of claim 1, wherein the sensor includes a camera.

12. The display of claim 1, wherein the display includes a moisture barrier disposed over the sensor.

13. The display of claim 12, wherein the moisture barrier extends in a direction toward an outside of the sensor and is connected with the thin film encapsulation layer.

14. A display comprising:
    a display substrate layer;
    an organic light emitting layer formed over the display substrate layer, the organic light emitting layer including a plurality of pixels;
    a thin film transistor array layer disposed between the display substrate layer and the organic light emitting layer, the thin film transistor array layer including a plurality of thin film transistors electrically connected with the pixels;
    a thin film encapsulation layer formed over the organic light emitting layer; and
    a seal configured to cover at least part of an inner sidewall of an opening formed through the display substrate layer, the organic light emitting layer, and the thin film transistor array layer, wherein the at least part of the inner sidewall of the opening includes at least part of a partial sidewall formed by the display substrate layer.

15. The display of claim 14, further comprising:
    one or more sensors, at least parts of which are disposed in the opening or under the opening,
    wherein the seal is formed between the opening and the sensors.

* * * * *